(12) United States Patent
Hellweg (10) Patent No.: US 10,761,420 B2
(45) Date of Patent: Sep. 1, 2020

(54) MICROLITHOGRAPHIC MASK, METHOD FOR DETERMINING EDGE POSITIONS OF THE IMAGES OF THE STRUCTURES OF SUCH A MASK AND SYSTEM FOR CARRYING OUT SUCH A METHOD

(71) Applicant: Carl Zeiss SMT GmbH, Oberkochen (DE)

(72) Inventor: Dirk Hellweg, Langenau (DE)

(73) Assignee: Carl Zeiss SMT GmbH, Oberkochen (DE)

(*) Notice: Subject to any disclaimer, the term of this patent is extended or adjusted under 35 U.S.C. 154(b) by 8 days.

(21) Appl. No.: 16/167,064

(22) Filed: Oct. 22, 2018

(65) Prior Publication Data
US 2019/0129320 A1 May 2, 2019

(30) Foreign Application Priority Data
Oct. 26, 2017 (DE) .................. 10 2017 219 217

(51) Int. Cl.
*G03F 1/44* (2012.01)
*G03F 1/84* (2012.01)
*G03F 7/20* (2006.01)
*G03F 9/00* (2006.01)

(52) U.S. Cl.
CPC .............. *G03F 1/44* (2013.01); *G03F 1/84* (2013.01); *G03F 7/70633* (2013.01); *G03F 9/7049* (2013.01); *G03F 9/7088* (2013.01)

(58) Field of Classification Search
CPC ........................................ G03F 1/44
USPC ............................................. 430/5
See application file for complete search history.

(56) References Cited

U.S. PATENT DOCUMENTS

| | | |
|---|---|---|
| 2010/0153059 A1 | 6/2010 | Klose et al. |
| 2011/0205549 A1 | 8/2011 | Hof et al. |
| 2012/0063666 A1 | 3/2012 | Arnz et al. |
| 2013/0063716 A1 | 3/2013 | Mann et al. |
| 2015/0001408 A1 | 1/2015 | Frank et al. |
| 2015/0310160 A1 | 10/2015 | Laske et al. |
| 2015/0330777 A1 | 11/2015 | Blaesing-Bangert |

FOREIGN PATENT DOCUMENTS

| | | |
|---|---|---|
| DE | 10 2006 059 432 A1 | 6/2008 |
| DE | 10 2007 033 814 A1 | 10/2008 |
| DE | 10 2010 029 049 A1 | 11/2011 |
| DE | 10 2010 045 135 A1 | 3/2012 |
| DE | 10 2013 212 613 A1 | 12/2014 |
| DE | 10 2014 209 455 A1 | 11/2015 |
| WO | WO 2008/071268 A1 | 6/2008 |
| WO | WO 2009/100856 A1 | 8/2009 |

OTHER PUBLICATIONS

German Office Action, translation therein, for corresponding DE Appl No. 10 2017 219 217.8, dated Jun. 13, 2018.

*Primary Examiner* — Christopher G Young
(74) *Attorney, Agent, or Firm* — Fish & Richardson P.C.

(57) ABSTRACT

For the purposes of measuring structures of a microlithographic mask, a method for capturing absolute positions of structures on the mask and a method for determining structure-dependent and/or illumination-dependent contributions to the position of an image of the structures to be imaged, or of the edges defining this structure, are combined with one another. As a result of this, establishing an edge placement error that is relevant to the exposure of a wafer and, hence, a characterization of the mask can be substantially improved.

20 Claims, 3 Drawing Sheets

MICROLITHOGRAPHIC MASK, METHOD FOR DETERMINING EDGE POSITIONS OF THE IMAGES OF THE STRUCTURES OF SUCH A MASK AND SYSTEM FOR CARRYING OUT SUCH A METHOD

CROSS-REFERENCE TO RELATED APPLICATION

The present application claims benefit under 35 USC 119 of German Application No. 10 2017 219 217.8, filed Oct. 26, 2017. The entire disclosure of this application is incorporated by reference herein.

FIELD

The disclosure relates to a microlithographic mask. Furthermore, the disclosure relates to a set including a plurality of such masks. Further, the disclosure relates to a method for determining edge positions of the images of the structures of such masks, a method for determining an overlay error or an error in the edge imaging of the structures of a plurality of such masks and a system for carrying out such a method. In addition, the disclosure relates to a method for producing a microstructured or nanostructured component and to a component produced according to the method. Moreover, the disclosure relates to the use of the method for measuring mask structures for optimizing an optical proximity correction.

BACKGROUND

In microlithography, structures of a mask with structures to be imaged, a so-called reticle, are imaged on a wafer via a projection exposure apparatus. The ultimately relevant qualification variable for the quality of the mask is the placement of the relevant structures, in particular the edges defining this structure, on the wafer during this imaging.

SUMMARY

The disclosure seeks to provide an improved a microlithographic mask and, in particular, a set including a plurality of such masks.

In some embodiments, the disclosure provides a mask including at least one marking with a so-called anchoring element for establishing the global position data of the mask and a test structure with structure elements which are imaged on a wafer when using the mask, wherein the structure elements of the test structure and the at least one anchoring element are arranged on the mask in such a way that their relative position in relation to one another is establishable by way of a local measuring method. In particular, the anchoring element can be a constituent part of the test structure. In particular, anchoring element and test structure can be identical. Also, structures present in the chip design can be used instead of specifically added metrology markers ("in-die measurement").

In particular, the structure elements of the test structure have a maximum spacing of at least one anchoring element, which is no more than one tenth, in particular no more than one hundredth, of a side length of the mask. In particular, the maximum distance between the structure elements of the test structure and the anchoring element is no more than 1 mm, in particular no more than 100 µm. In particular, it is no greater than the diameter of an image field of a measurement system or measurement method used for imaging, in particular measuring and/or characterizing, the test structure. In particular, this measurement system is an actinic measuring device; the corresponding method is accordingly referred to as an actinic method. It is also referred to as an aerial image method.

An actinic measuring device is understood to mean a measuring device that operates at the same wavelength as the exposure system used for imaging the structures of the mask onto a wafer. In the case of masks for EUV lithography, this wavelength lies in the region of less than 30 nm, in particular at 13.5 nm.

In particular, a so-called aerial image measurement system (AIMS) serves as a system for characterizing the test structure.

Corresponding systems are known from DE 10 2010 029 049 A1 and DE 10 2013 212 613 A1.

The anchoring element serves, in particular, for binding the measurement data characterizing the test structure to global position data of the mask, which are established with the aid of a so-called registration method or registration system. Within the scope of such registration measurement, the global placement of structures on the mask, in particular, is captured. Corresponding registration systems can highly precisely determine the placements of the corresponding structures, in particular of the anchoring elements, over the entire area of the mask. The accuracy of such measurements can be better than 1 nm, in particular better than 0.5 nm. In particular, the anchoring element is embodied in such a way that measurements at a wavelength of more than 100 nm, for example 193 nm, can be carried out with a registration system. In particular, it is embodied in such a way that its position on the mask, in particular relative to the side edges of the mask or the alignment markers used in the wafer exposure apparatus, can be measured at an appropriate wavelength by a method.

According to one aspect of the disclosure, provision is made, in particular, of arranging a regular grid, in particular a matrix-like grid, of anchoring elements on the mask. This grid is also referred to as a raster. The totality of the anchoring elements are also referred to as an anchoring structure.

Corresponding apparatuses (registration systems) are known from DE 10 2007 033 814 A1 and WO 2008/071 268 A1 and DE 10 2014 209 455 A1, for example. Reference is made to these documents in respect of further details relating to corresponding apparatuses.

According to the disclosure, it was recognized that the relevant variable for the result of the lithography process is not so much the placement of the structures to be imaged on the reticle but more the placement thereof on the wafer. Further, it was recognized that the placement of the structures to be imaged on the wafer does not only depend on their global placement on the mask but also that this variable is also a function of exposure and imaging conditions, in particular, for example, the chief ray angle, the illumination setting used for the illumination, the wavelength of the illumination radiation, and of characteristics of the structures to be imaged themselves, in particular, for example, the pitch, the topography and the alignment of the structures.

The masks according to the disclosure render it possible to combine the information about the absolute placement of the structures on the mask, or the deviation thereof from a predetermined setpoint position, and the structure/illumination-specific effects of the imaging of the corresponding structures on the wafer, in particular the edge placement or the deviation thereof from a setpoint position, which is also referred to as edge placement error (EPE). As a result of this, the precision of the structures on the wafer, and hence the quality of the microstructured or nanostructured components produced via a microlithography method, is substantially improved.

The mask can be, in particular, a mask for DUV or EUV microlithography.

The advantages of the disclosure are brought to bear particularly advantageously in a set including a plurality of corresponding masks, which are provided for multiple exposure of a wafer. Here, the relative placement of the images of the structures to be imaged of the different masks, i.e., of the overlaid layers, on the wafer are of decisive importance for the quality of the component to be produced.

As a common reference point, all masks of the set preferably have at least one identical anchoring element. In particular, the anchoring element is arranged at an identical position on the mask in each case.

The masks of the set can be selected according to their characterization in such a way that the relevant edge placement errors of the overlaid layers do not exceed a predetermined maximum absolute value. For the functionality of the subsequent chip, it is less the absolute placement of the structure edges and rather the relative placement of layers overlaid upon one another that is relevant. A qualification of the masks by way of their relative error in the edge placement can have significant advantages in the yield of the mask production process in comparison with an independent individual qualification. The desired manufacturing properties, and hence the costs, can be lowered in the case of the same yield. In mask qualification, high process reliability for the wafer exposure process is demanded; i.e., the masks are only accepted if they virtually certainly lead to functioning chips. Typically, confidence levels of 99.7% (i.e., satisfying the 3 sigma value of statistical variations) or higher are involved here. In the case of a single qualification, virtually the most inexpedient combination of the placement errors, as a consequence thereof, meets the specification, i.e., the sum of the absolute values at each measured point. However, in the real manufacturing process, there are many systematic errors that act the same on all masks manufactured by the same machines and that are consequently cancelled in relative qualification. By way of example, if a relative error in edge placement of 2 nm is involved for the contribution of the mask set, a manufacturing process with repeated errors and statistical errors of respectively 1.0 nm (3 sigma) would lead to a yield of significantly above 99.7% (statistical summation for the relative error would be 1.4 nm for the 3 sigma value). In the individual qualification, an absolute error of approximately 1 nm would be involved for each mask and at least 50% of the masks could not be qualified.

The disclosure also seeks to provide an improved method for determining edge positions of the images of the structures of a microlithographic mask. The method is, in particular, a method for determining an edge placement error of a microlithographic mask.

In some aspects, the disclosure provides a method including the following steps:
   determining the absolute position of at least one anchoring element on the mask in at least one first measuring step,
   determining a relative position of an image of at least one test structure relative to the position of an image of one of the anchoring elements in at least one second measuring step, wherein an aerial image method serves to determine the relative position of the image of the test structure,
   determining an absolute position of the image of the test structure from the absolute position of at least one of the anchoring elements and the relative position of the image of the test structure in relation thereto,
   determining a deviation of the absolute position of the image of the test structure from a setpoint position.

The method is, in particular, a two-stage method. Firstly, there is an establishment of global position data of metrology markers, which, in particular, include the anchoring elements, on the mask in a first measuring method, in particular a so-called registration method. Moreover, in a second measuring method, the relative positions of the images of a test structure are locally established relative to the position of the image of one of the anchoring elements in an aerial image. In this second, local measuring method, there is establishment of structure-specific and/or illumination-specific contributions, in particular, for accurately positioning the image of the test structure relative to that of the anchoring elements. Here, in particular, the edge position of the relevant structures is determined relative to the position of the anchoring structure, i.e., to the totality of the anchoring elements arranged on the mask.

With the aid of the method, a structure-specific and/or illumination-specific edge placement error of a microlithographic mask, in particular, is determined.

Here, a so-called registration error, which characterizes the placement on the substrate of the mask, and a structure-specific and/or illumination-specific contribution, which results from the imaging of the mask, are combined with one another. As a result, it is possible to establish a map of the edge placement error over the entire surface of the mask, which takes account of the global measurement of the registration error and the respective structure-specific and/or illumination-specific contribution. This result can be used both for qualifying the mask and in process development for optimizing the optical proximity correction (OPC). The object of the optical proximity correction is, in particular, to have available the structure-specific and illumination-specific contributions in the imaging in the mask design. This allowance can be measured and hence optimized using the present disclosure.

What is particularly advantageous here is that the high precision of the establishment of a structure-independent contribution to the edge placement error of non-actinic systems or methods that are optimized to corresponding measurements can be combined with a characterization of structure-specific and/or illumination-specific contributions, which cannot be characterized by such methods but which can, by all approaches, be characterized with the aid of an aerial image method.

According to one aspect of the disclosure, structure-dependent contributions are established when determining the relative position of the image of the at least one test structure relative to the position of the image of one of the anchoring elements. In particular, it is also possible to establish illumination-dependent contributions. In this respect, it was recognized that the relative position of the image of the at least one test structure depends, firstly, on the details of the test structure itself, in particular, e.g., the line density, the alignment thereof, the material properties of the absorber and multilayer defining the structure, the edge angles and line roughnesses, the surface roughness of the mask, and, secondly, on the illumination setting provided for imaging the test structure, in particular the chief ray angle, and the wavelength of the illumination radiation provided for imaging, which is also referred to as imaging wavelength $\lambda$, and the numerical aperture (NA) used in the imaging.

Since structure-dependent and/or illumination-dependent contributions to the relative position of the image of the test structure are taken into account, the precision of the imaging of the relevant structures onto the wafer can be significantly improved in a subsequent structuring method.

According to a further aspect of the disclosure, contributions which can be compensated during the lithography method via a projection exposure apparatus (so-called "correctables") are taken into account when determining the deviation of the absolute position of the image of the test structure from the setpoint position.

When calculating the registration error, it is possible to take account of, in particular, constant, global errors, such as, e.g., a linear shift or a rotation of the entire mask structure or—at least to a certain degree—a uniform scaling of same. The errors referred to as "scale", "ortho" and "offset" are considered to be typical correctables, i.e., errors that are compensatable via a scanner. These are errors in the mask production. "Scale" is a scale error, "offset" is the decentration of the entire mask structure relative to the substrate or relative to the align marks, and "ortho" is a rotation of the entire mask structure.

According to a further aspect of the disclosure, a non-actinic method serves to determine the absolute position of the at least one anchoring element. A non-actinic method is understood to mean a measuring method in which use is made of a different wavelength to the one that is used later for exposing the wafer. In conjunction with EUV masks, non-actinic wavelengths are, in particular, greater than 30 nm. By way of example, typical non-actinic wavelengths for EUV masks are 193 nm, 248 nm or 365 nm.

The method for determining the global, absolute position of the at least one anchoring element is, in particular, an optical method with a first measurement wavelength $\lambda 1$. In particular, the measurement wavelength $\lambda 1$ is greater than 100 nm, $\lambda 1 > 100$ nm. In particular, the measurement wavelength can be 193 nm, 248 nm or 365 nm; $\lambda 1 = 193$ nm, $\lambda 1 = 248$ nm or $\lambda 1 = 365$ nm.

According to a further aspect of the disclosure, the image field of the measuring apparatus provided for determining the absolute position of the at least one anchoring element is at least as large as the mask to be measured. This is particularly advantageous since the global measurement of the mask can be carried out particularly easily and quickly in this case. However, this is not mandatory. The measuring device for determining the global position data on the mask may also have a smaller image field.

According to a further aspect of the disclosure, an actinic method serves to determine the relative position of the image of the at least one test structure.

In particular, an optical method with a second measurement wavelength $\lambda 2$, which, in particular, precisely corresponds to the imaging wavelength provided for imaging the structures on the mask on a wafer, serves to determine the relative position of the image of the at least one test structure. In particular, this can be a wavelength in the DUV or EUV range. In particular, this can be a wavelength in the range from 5 nm and 30 nm; in particular, the following can apply: $\lambda 2 = 13.5$ nm.

In the case of a mask for a DUV scanner, the second measurement wavelength $\lambda 2$ lies, in particular, in the DUV range. In particular, the following can apply: $\lambda 2 = 193$ nm.

In general, the following, in particular, applies: $\lambda 2 \leq \lambda 1$, in particular $\lambda 2 \leq 0.1 \lambda 1$.

According to a further aspect of the disclosure, provision is made for the imaging properties of the scanner provided for the subsequent imaging of the mask to be reproduced or for at least a selection of same to be reproduced for the purposes of determining the relative position of the image of the at least one test structure. When determining the relative position of the image of the at least one test structure, a selection of wavelength, illumination setting, numerical aperture (NA) and chief ray angle, in particular, can be predetermined according to the values that are used later for imaging the mask.

As a result of this, the position of the image can be established under the real imaging conditions of the scanner.

According to further aspect of the disclosure, a plurality of second measuring steps are carried out, wherein a chief ray direction is varied in each case.

As a result of this, it is possible to establish a dependence of the relative position of the image of the test structure on the chief ray direction. In particular, it is possible to establish a shift of the relative position of the image of the test structure depending on the chief ray direction. This can be used for calibrating a profile of the structure-dependent and/or illumination-dependent contributions to the edge placement error over the mask, in particular in order to take account of a profile of the imaging conditions over the mask positions, in particular, e.g., a chief ray direction that varies over the illumination slit of a scanner provided for imaging the mask.

According to one alternative, a corresponding profile can also be determined with the aid of a simulation and/or kept available by computational method.

According to the disclosure, it is preferable to calibrate the profile over the field with the aid of a plurality of measurements, for example with different chief ray directions and/or different illumination settings.

According to a further alternative, it is possible to use the intensity variations in the aerial image caused by the surface roughness of the mask as a reference for the purposes of determining the displacement of the images on account of chief ray variations. This so-called speckle pattern is an image of the surface topography of the mask and hence characteristic for the respective position on the mask substrate.

According to a further aspect of the disclosure, the method described above facilitates, in particular, an improvement in a method for determining an overlay error or an edge placement error of a plurality of microlithographic masks.

Here, the relative deviation of structure elements on different masks, which have, at least in regions, identical setpoint positions, is determined. In particular, the relative error of edges to be printed over one another is determined. This is a particularly relevant variable for the quality of the microstructured or nanostructured component that was produced by a multiple exposure process with different masks.

The disclosure further seeks to provide an improved system for carrying out a method according to the preceding description.

In some aspects, the disclosure provides a system including a first measuring apparatus for determining global position data on the mask, a second measuring apparatus for determining a structure-dependent contribution to the edge placement and a data processing device for establishing a map of an edge placement error over the entire surface of the mask from the global position data and the structure-dependent contribution to the edge placement.

In respect of the advantages and details, reference is made to the description above. The first measuring apparatus is, in particular, a registration system, in particular a non-actinic registration system.

The second measuring apparatus is, in particular, an aerial image system (AIMS, aerial image metrology system).

According to a further aspect of the disclosure, the data processing device of the system for carrying out the method described above is signal-connected to the first measuring apparatus and/or the second measuring apparatus.

This renders it possible, in particular, to undertake an online characterization of the mask. The mask-specific maps of the edge placement error can be saved in a memory, in particular a database of the data processing device.

According to a further aspect of the disclosure, the data processing device is signal-connected to a correction apparatus for correcting mask errors.

This renders it possible, in particular, to directly correct errors that were established when measuring the masks (a so-called "closed-loop method"). This reduces the rejects, i.e., the proportion of masks that do not meet predetermined quality criteria, in particular in view of the maximum permissible edge placement error.

In some aspects, the disclosure seeks to provide an improved method for producing a microstructured or nanostructured component and also a corresponding component.

In some aspects, the disclosure provides at least one mask, in particular a plurality of masks, for structuring a wafer via a lithography method, being characterized initially with the aid of the method described above.

As already described, this can improve the precision of the structures on the component.

Further advantages and details of the disclosure emerge from the description of exemplary embodiments with reference to the drawings.

BRIEF DESCRIPTION OF THE DRAWINGS

Further advantages and details of the disclosure emerge from the description of exemplary embodiments with reference to the drawings, in which.

DETAILED DESCRIPTION

In microlithography, structures arranged on a mask 1, which is also referred to as a reticle, are imaged onto a light-sensitive layer of a wafer. Serving to this end there is a projection exposure apparatus with a scanner, which includes an illumination optical unit for illuminating the mask 1 and a projection optical unit for imaging the structures on the mask 1 onto the wafer.

Details of a corresponding projection exposure apparatus are known from the prior art. To this end, reference is made to WO 2009/100856 A1 in representative fashion.

In order to make the density of the structure elements on the wafer as large as possible, in particular radiation in the DUV wavelength range, in particular imaging radiation with an imaging wavelength of 193 nm, or in the EUV wavelength range, in particular in the range from 5 nm to 30 nm, in particular of 13.5 nm, serves to image the structures on the mask 1 onto the wafer.

In particular, the mask 1 is a reflective mask which is used in the reflection mode. For the purposes of imaging the structures of the mask 1 onto the wafer, the illumination radiation is, expressed differently, reflected at the mask 1, in particular at three-dimensionally embodied structures 7, to be imaged, on the mask 1.

The precision of the placement of the structures, in particular of the edges defining this structure, on the wafer is one of the most important variables for the result of a lithography process, in particular for the quality of the component produced via a lithography method. The placement of the structures on the wafer depends on the accurate placement of the structures on the mask 1. According to the disclosure, it was recognized that the placement of the structures on the wafer moreover has a dependence on exposure- and imaging-conditions, for example the chief ray angle, the employed illumination setting, the wavelength of the illumination radiation and other parameters, such as on the structure to be imaged itself, for example the line density, the pitch and the exact topography of the structure.

The exact placement of the structures on the wafer can be characterized by, in particular, the so-called edge positions (edge placements) or the deviation thereof from a setpoint position, the edge placement error (EPE).

The variables of overlay, global CDU (profile of the structure size over the mask), OPC error (inaccuracy/error when storing the imaging properties in the mask design) and linewidth roughness (line roughness) of the structures to be imaged are included, inter alia, in the edge placement error. The structure-independent mask contribution to the overlay is also referred to as a registration error or, briefly, as registration.

Below, a method for establishing an edge placement error for the entire mask 1 is described with reference to FIG. 1.

According to the disclosure, the placement of structures on the mask 1 is captured in a first measuring step 2. The first measuring step 2 is also referred to as a registration measurement. The first measuring apparatus 3, in particular, serves for the registration measurement. The first measuring apparatus 3 is also referred to as a "prove tool" or, more generally, as a "registration tool". In particular, this is a non-actinic measuring apparatus.

The first measuring apparatus 3 is an optical measuring apparatus, in particular a metrology system. The registration measurement is carried out, in particular, at a first measurement wavelength $\lambda 1$ of 193 nm, 248 nm or 365 nm. The first measurement wavelength $\lambda 1$ can also be longer. In particular, the first measurement wavelength $\lambda 1$ is greater than 100 nm.

Via the first measuring apparatus 3, it is typically possible to determine the position of the structures on the mask 1 with an accuracy of 1 nm or better.

In particular, it is possible to determine the position of the structures over the entire surface of the mask 1. The first measuring step 2 is therefore also referred to as a global position measurement.

The image field of the first measuring apparatus 3 is normally significantly smaller than the mask. A highly precise measurement over the entire mask is achieved by way of a correspondingly highly accurate stage movement. FIG. 1 schematically illustrates a mask 1 with a side length 1. By way of example, the side length 1 can be 152 mm. Other dimensions of the mask 1 are likewise possible.

In the first measuring step 2, deviations of the positions of so-called anchoring elements 4 from predetermined setpoint positions of these elements are established in particular. In particular, a global registration map 5 of the mask 1 is determined. This is illustrated schematically in FIG. 1. The number of anchoring elements 4 should be interpreted as being schematic. At least one anchoring element 4 is provided on the mask 1. Usually, a multiplicity of anchoring elements 4 are provided on the mask 1. The anchoring elements 4 are preferably arranged in a matrix-like manner, in particular on the mask 1 in rows and columns. The totality of the anchoring elements 4 are also referred to as an anchoring structure.

Preferably, the anchoring elements 4 for different masks 1 are arranged at identical positions of the masks 1. In particular, they are arranged in identical positions relative to the boundary edges of the masks 1. This renders it possible to compare the global position data of different masks 1 to one another.

Figure 1:
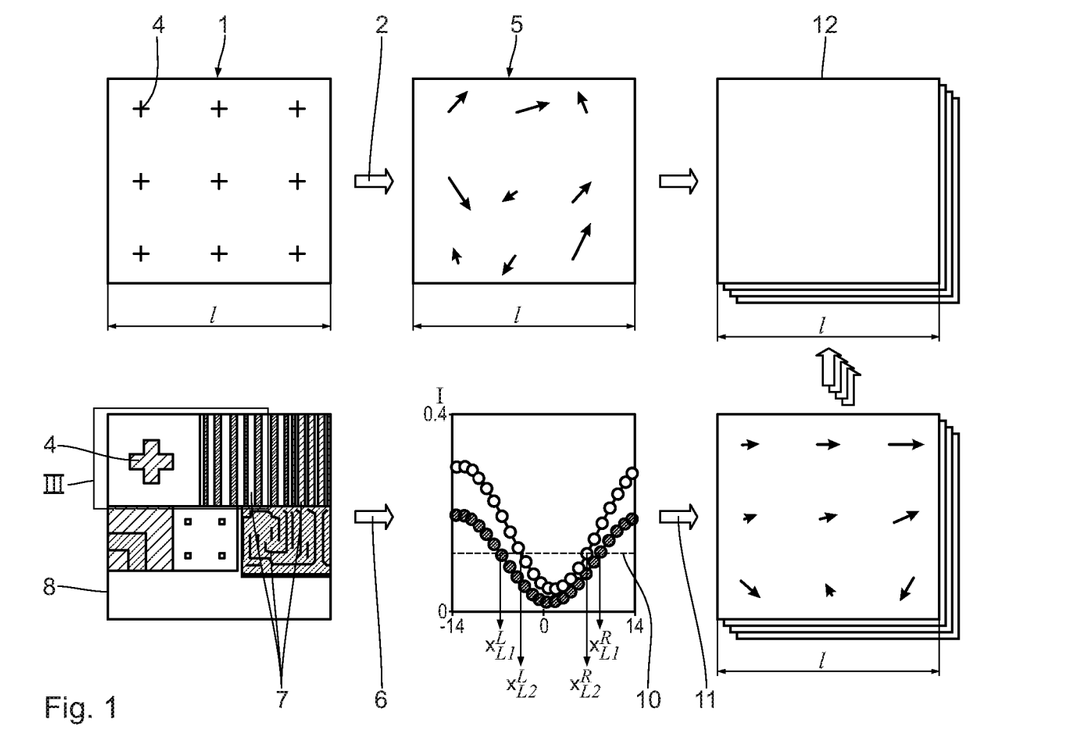
FIG. 1 schematically shows a sequence of details or intermediate steps in a method for establishing a map of the edge placement error over the entire surface of a lithography mask.

The anchoring elements 4 schematically illustrated in FIG. 1 are not illustrated true to scale. Usually, they are substantially smaller than what is illustrated in FIG. 1.

In particular, the anchoring elements 4 can have a cross-shaped embodiment. In particular, they each have two limbs which are arranged parallel to the side edges of the mask 1. The structure, in particular the totality of the anchoring elements 4, via which the data from the first measuring step 2 are tied to the data from the second measuring step 6, is also referred to as an anchoring structure.

In a second measuring step 6, the image of the mask 1 is measured under emulation of the relevant imaging conditions in the projection exposure apparatus. Here, in particular, the structure- and imaging-dependence of the structures 7 to be imaged on the wafer is captured as is relevant to the subsequent wafer exposure. The structures 7 to be imaged, which are also referred to as test structures below, are only illustrated in schematic and exemplary fashion in FIGS. 1 and 3. The test structure includes different structure elements that are imaged on the wafer if the mask 1 is used with illumination radiation at an imaging wavelength λ2.

In particular, an aerial image method serves as a second measuring step 6. In particular, this can be an actinic method.

In principle, the first measuring step 2 and the second measuring step 6 for measuring the mask 1 can also be carried out with illumination radiation of the same wavelength, in particular with a wavelength of 193 nm.

As illustrated schematically in the central image in the lower row of FIG. 1, in particular the aerial image intensity I in predetermined sections of the image field 8 of a second measuring apparatus 9 is established in the second measuring step 6. From this, the edge position of the images of the test structure can be established via a threshold method, in which a predetermined threshold 10 is predetermined. In particular, it is possible to determine the relative (edge) position of the images of the test structure relative to the position of the images of the anchoring elements 4. This will be explained in even more detail below.

The image field 8 of the second measuring apparatus 9 is substantially smaller than the mask 1.

The image field 8 of the second measuring apparatus 9 has, in particular, a maximum extent in the range from 1 μm to 1 mm.

FIG. 1, lower row, central image illustrates, in an exemplary manner, edge positions of the left boundary edges of two structures $(x_{L1}^L, x_{L2}^L)$ and of the right boundary edges $(x_{L1}^R, x_{L2}^R)$ emerging after the application of the threshold method.

By evaluating 11 the established edge positions $x_{Li}^{L/R}$ relative to the image of the anchoring elements, it is possible to establish the edge placement error on the employed measurement grid (3×3 in the image) for each of the four edges delimiting the two structures. Consequently, it is possible to create a map of the respective edge placement errors relative to the anchoring element. A map of corresponding error in the edge position $x_{Li}^{L/R}$ is illustrated in a representative and exemplary manner in FIG. 1, lower row, far right. Corresponding maps are established for the remaining edge positions $x_{Li}^{L/R}$. The variation over mask position results from the position-dependent variation in the imaging conditions, i.e., for example, the variation of the chief ray angle. If work is carried out with non-position-dependent imaging conditions, the measurement of the metrology markerers at different mask positions can be dispensed with in the second measuring step 6; i.e., the structure-dependent displacements are established at one position only. In this case, a displacement vector (instead of a map) emerges for each edge position.

The maps of the edge placement errors depend, in general, on the wavelength of the illumination radiation and on the illumination setting. In particular, maps are established for a predetermined wavelength and for a predetermined illumination setting of the scanner, which is intended to be used for subsequent imaging of the mask 1. There is a dedicated map for each edge on account of the structure dependence.

The vector lengths, illustrated in FIG. 1, lower row, far right, for elucidating the edge placement errors are not illustrated true to scale relative to the edge length 1 of the mask 1. Typically, the scale of the vector length of the edge placement errors is of the order of 1 nm.

By combining the global registration map 5 and the structure-specific deviations established via the second measuring apparatus 9, it is possible to establish a structure-specific map 12 of the edge placement error of the entire mask 1. This will be explained in even more detail below.

Below, different aspects of the method are explained once again in note form.

FIG. 1, top left, schematically illustrates the mask 1 with anchoring elements 4, which are also referred to as registration marks. From measuring the position of the registration marks, the registration error is determined over the entire mask 1 in the first measuring step 2 (see FIG. 1, top row, centre).

The image field 8 of the second measuring apparatus 9 also includes a few of the structures 7 to be imaged in addition to at least one of the anchoring elements 4. This is illustrated schematically in FIG. 1, bottom left.

In particular, the threshold just corresponds to the exposure threshold of the photoresist subsequently used during the wafer exposure.

By combining the results of the two measuring steps 2 and 6, the real placement of the relevant structures, more precisely of the edges defining these structures, or the deviation thereof from a setpoint placement in the wafer image can be determined substantially more accurately than with one of the two measuring apparatuses 3, 9 on their own. By combining the two measurements, the structure-specific and/or illumination-specific contribution to the edge placement error of the structures 7 to be imaged only becomes qualifiable.

The anchoring elements 4 can serve only for the registration measurement process and can be irrelevant to the electrical functionality of the component to be subsequently produced. As an alternative thereto, it is possible to use as anchoring elements 4 structures that are also of importance to the electrical functionality of the component to be produced.

Measuring the accurate position of the edges defining the structures 7 to be imaged, in particular the images thereof in the image field of a projection exposure apparatus, i.e., on the wafer to be subsequently structured, is not possible, or at least not possible under realistic conditions, using the first measuring apparatus 3. The second measuring step 6 with the aid of the second measuring apparatus 9 is used to determine the dependence of the edge positions of the structures 7 to be imaged under the imaging conditions that are used for exposing the wafer. In the process, one or more local regions of the masks 1 are measured.

If desired, the image field 8 can be effectively expanded by placing a plurality of image fields next to one another.

Since the images of the structures 7 to be imaged do not exhibit any sharp edge profiles but only a gradual intensity profile, for example a sinusoidal profile for dense lines in the vicinity of the resolution limit of the second measuring apparatus 9, the edge position of the images of the structures 7, to be imaged, on the wafer depends on the employed exposure threshold. For the correct determination of the relative edge positions to one another, it is therefore desirable for the intensity profiles relative to one another to correspond to those of the aerial image of the projection exposure apparatus. Then, the structure-specific contributions to the edge placement error under the given imaging conditions can be established (evaluation 11) from the edge positions ($x_i$) established in the second measuring step 6.

By way of example, a displacement of the edge positions in the aerial image can be traced back to shadowing effects on account of a non-perpendicular chief ray angle. Such shadowing effects are dependent on, inter alia, the wavelength of the employed illumination radiation. The second measuring step 6 is therefore carried out at a second measurement wavelength 2, which just corresponds to the imaging wavelength of the illumination radiation provided when using the mask 1 for structuring a wafer.

The shadowing effects are also dependent on, inter alia, the chief ray angle of the illumination radiation.

The chief ray angle can be, e.g., 5° to 9°, in particular 6°. In particular, that can vary over the width of the illumination slot. This can lead to an offset of the images of the structures 7 to be imaged depending on the field position or the position thereof on the mask 1. It has been shown that the field-dependent offset in current EUV exposure apparatuses typically lies at more than 1 nm; i.e., taking account thereof is very relevant.

By way of example, this offset can be made available on the basis of simulations. It can also be measured directly with the aid of the method described above.

For the subsequent structuring of a wafer, provision can be made for the latter to be exposed multiple times. Here, structures 7, to be imaged, of different masks 1 can be imaged on the wafer. In particular, it is possible to carry out overlaid images, which are also referred to as layers. With the aid of the method described above, it is possible to qualify relative to one another the relative position of the structures 7 to be imaged of this layer, i.e., the images of different masks 1.

A set with a plurality of masks, which are provided for a multiple exposure of a wafer, preferably includes anchoring elements 4 that are identical, in particular arranged in identical fashion, on all masks. The masks each have at least one identical anchoring element 4, in particular at least one identically arranged anchoring element 4.

Figure 2:
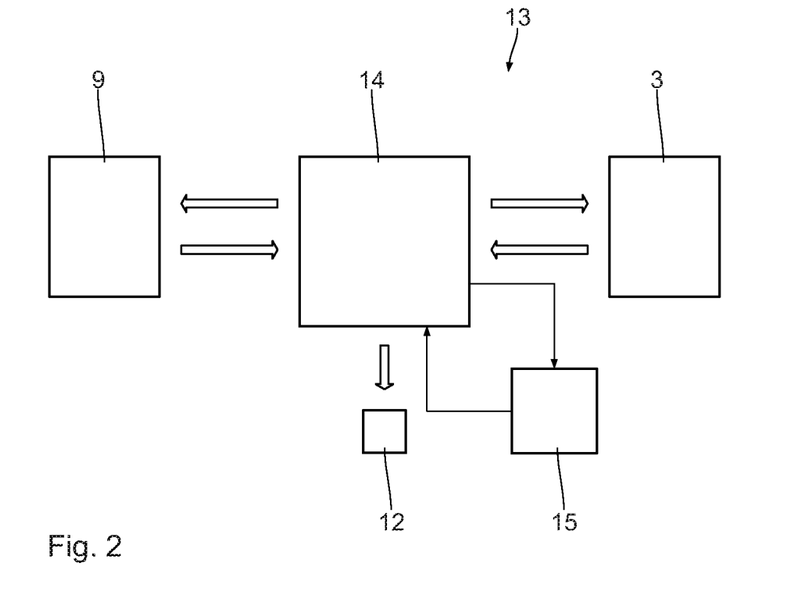
FIG. 2 schematically shows the constituent parts of a system for carrying out a method according to FIG. 1.

FIG. 2 schematically illustrates a system 13 for carrying out the method described above. In addition to the first measuring apparatus 3 and the second measuring apparatus 9, the system 13 includes a data processing device 14.

The data processing device 14 is signal-connected to the first measuring apparatus 3. The measurements carried out via the first measuring apparatus 3 are controllable, in particular, via the data processing device 14. The results of the first measuring steps 2 are transmitted, in particular, to the data processing device 14. They can be processed further via the data processing device 14. In particular, they can be stored in a database via the data processing device 14.

The data processing device 14 is signal-connected to the second measuring apparatus 9. The second measuring step 6 carried out via the second measuring apparatus 9 can be controlled, in particular, via the data processing device 14. The results of the second measuring steps 6 can be transmitted, in particular, to the data processing device 14. In particular, they can be processed further via the data processing device 14. In particular, they can be stored in a database via the data processing device 14.

Moreover, the data processing device 14 is signal-connected to a correction apparatus 15. The correction apparatus 15 is controllable, in particular, via the data processing device 14. The corrections carried out via the correction apparatus 15 can be transmitted to the data processing device 14. Mask errors can be repaired via the correction apparatus 15.

Via the data processing device 14, it is possible to qualify different masks 1 independently of one another. It is also possible to take account of the subsequent arrangement of the layers and to evaluate measurement results of masks 1 subsequently provided for the multiple exposure of a wafer relative to one another.

In particular, the data processing device 14 includes a server.

The mask 1 includes at least one metrology marker, which is also referred to as a metrology target, including the anchoring structure with the anchoring elements 4 and at least a subset of the structures 7 to be imaged or structures which are similar to the imaging properties thereof.

Consequently, the positions of the structures 7 to be imaged are not measured directly on the mask 1 in the second measuring step 6; instead, the images thereof are measured in an image field of the second measuring apparatus 9. Here, in particular, a relative position of the images of the structures 7 to be imaged is determined relative to an image of at least one of the anchoring elements 4.

Preferably, corresponding measurements are carried out for each of the anchoring elements 4. As a result of this, it is possible, in particular, to determine a dependence of the relative placement or the offset thereof on the position of the structures 7, to be imaged, on the mask 1.

The absolute positions of the edges that are relevant to the structuring of the wafer can be established from the absolute position of the anchoring elements 4 measured in the first measuring step 2 and the relative displacement of the edges established in the second measuring step 6. In principle, a correction for taking account of the calibrated chief ray angle dependence of the displacement can be carried out in the case of the relative displacement of the edges. Then, the edge placement error emerges from the difference between the absolute position of the edges and the setpoint positions thereof. When calculating this placement error, it is possible to take account of errors which uniformly relate to the entire mask 1, such as, e.g., displacements, rotations or scale errors of the entire mask structure. By way of example, these errors that are correctable in the scanner image can be represented by a coordinate transformation: (x', y') are the coordinates in the transformed system; (x, y) are those in the original system, e.g., with an origin in the centre of the mask. (x', y')=(mag$_x$, mag$_y$)*R (x+dx, y+dy), where R is the 2×2 rotation matrix with elements R$_{11}$=cos α, R$_{12}$=−sin α, R$_{21}$=sin α, R$_{22}$=cos α. The parameters, i.e., the magnifications mag$_x$ and mag$_y$ in the x- and y-directions, the angle of rotation α and the displacements dx and dy are chosen in such a way here that the residual error of the edge positions is minimized. The residual error established thus corresponds to the edge placement error during the wafer exposure since displacement, rotations and scale errors are typically corrected during the mask alignment (adjustment of the mask relative to the wafer) in the wafer exposure apparatus. If the wafer exposure apparatus is able to remove further error profiles, these can be represented in an analogous fashion by way of a corresponding coordinate transformation.

Further details of the disclosure are described below.

In general, the anchoring elements 4 will have a different offset in relation to their setpoint positions in the first measuring step 2 than in the second measuring step 6. This can be traced back, inter alia, to the different imaging conditions which can lead to shadowing effects in combination with three-dimensional mask structures.

If the first measuring step 2 and the second measuring step 6 are carried out with invariant imaging conditions for all mask positions in each case, the difference is identical for all points on the mask 1. In particular, the offset then is constant over all mask positions. It can be eliminated by the application of the correctables described above and it is consequently irrelevant to determining the edge placement errors. In this case, there are no problems tying together the data from the second measuring step 6 and those from the first measuring step 2.

Provided the second measuring step 6 is carried out with imaging conditions that depend on the mask position, the offset is generally no longer identical over all mask positions. By way of example, the chief ray angle varies depending on the mask position in EUV lithography. Although a constant offset contributes most to the offset as a rule, it may be advantageous here to also take account of the profile of the imaging conditions over the mask positions. Different options are proposed to this end:

A first option consists of embodying the anchoring elements 4 in such a way that they are as insensitive as possible in relation to shadowing effects. Since shadowing depends on the absorber thickness, a structure with very thin absorbers (i.e., for example, locally thinned or applied), for example, would be comparatively insensitive.

Moreover, it is possible to keep available the profile of the imaging conditions over the mask positions in computational fashion when determining the edge placement errors. To this end, the profile can be determined via a simulation. As a result, the error can be substantially reduced in comparison with the correction being dispensed with. Remaining residual errors on account of an imprecise knowledge of the mask structure (e.g., material constants, 3D edge profile of the structured mask absorber, surface roughness) can be tolerated.

According to a preferred variant, the profile is calibrated over the field. To this end, the position displacement of the anchoring elements 4 is measured when varying the chief ray angle. Then, subsequent measurements can be corrected accordingly.

Should the position stability of the second measuring apparatus not be sufficient to this end, use can be made of a so-called speckle pattern as a reference. The speckle pattern results from the surface topography of the mask 1 and is an image of same. Since surface unevennesses of the mask 1 typically lie in the region of at most 50 pm but the absorber thicknesses of the mask 1 are 50 nm and more, the speckle pattern is virtually uninfluenced by shadowing effects.

The metrology markers can each be measured, in particular, with a fixedly predetermined chief ray angle, for example the chief ray angle of the chief ray in the field centre of the scanner, and with the chief ray angle of the scanner belonging to the respective position of the metrology marker. Consequently, each metrology marker is measured twice, in particular at least twice, with different chief ray angles. Since the speckle pattern when measuring the metrology markers is substantially independent of the chief ray angle, it can serve as a reference for the purposes of determining the chief-ray-dependent displacement of the anchoring elements 4.

Provided the structures 7 to be imaged are embodied in such a way that they lie above the resolution limit of the first measuring apparatus 3, they, too, can serve as anchoring elements 4 themselves. In this case, separate anchoring elements 4 can be dispensed with.

Below, details of determining the relative positions of the images of the structures 7 to be imaged and of the anchoring elements 4 are described in exemplary fashion with reference to FIGS. 3 and 4.

Figure 3:
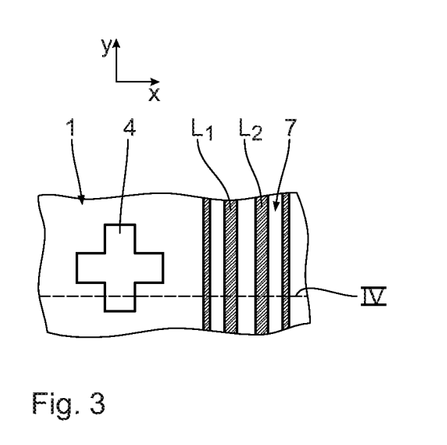
FIG. 3 shows a sectional magnification according to the region III of the mask illustrated in an exemplary fashion in FIG. 1.

FIG. 3 illustrates, in an exemplary manner, a section corresponding to the region III from the image field 8 of the second measuring apparatus 9 that is illustrated in FIG. 1. In particular, an anchoring element 4 that is embodied shaped like a cross and a so-called two-bar structure with an assist feature (to the left and right of the actual lines L1 and L2 in the image) are illustrated for explanation purposes. The assist features are structures on the mask that are not imaged during the wafer exposure process but have a positive influence on the imaging of the neighbouring structures L1 and L2, for example within the meaning of process window enlargement. The two-bar structure includes two stripes L1, L2. In the second measuring step 6, the left edge $x^{2,l}$ and the right edge $x^{2,r}$ of the anchoring element 4, $x^{2,l}_{anchor}$, $x^{2,r}_{anchor}$, and of the stripes L1, L2, $x^{2,l}_{L1}$, $x^{2,r}_{L1}$, $x^{2,l}_{L2}$, $x^{2,r}_{L2}$, are established in each case.

In the second measuring step 6, the mean value of the two edge positions is used as the position of the anchoring element:

$$x^{2,raw}_{anchor}=(x^{2,l}_{anchor}+x^{2,r}_{anchor})/2$$

Only the establishment of the positions in the x-direction is presented below.

The position $x^{l}_{anchor}$ of the anchoring element 4 is established in the first measuring step 2 with the aid of the first measuring apparatus 3.

Figure 4:
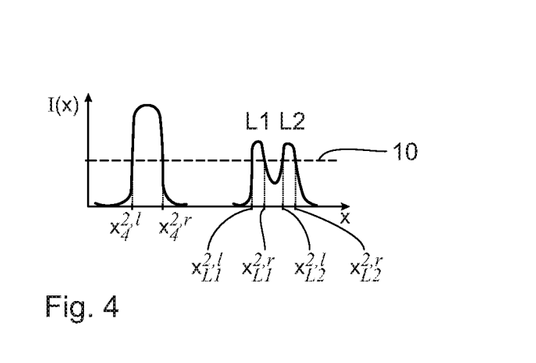
FIG. 4 schematically shows the profile of an aerial image intensity of the figure illustrated in FIG. 3 along the line IV.

As illustrated in exemplary fashion in FIG. 4, the positions of the anchoring element 4 and of the two stripes L1, L2 of the structure 7 to be imaged are established in the second measuring step 6.

The absolute edge positions of the structures 7 to be imaged, in particular of the two stripes L1, L2, are calculated as follows: $x^{l}_{L1}=x^{2,l}_{L1}-(x^{2,raw}_{anchor}-\Delta x^{CRA}_{anchor})+x^{l}_{anchor}$, $x^r_{L1} = x^{2,r}_{L1} - (x^{2,raw}_{anchor} - \Delta x^{CRA}_{anchor}) + x^l_{anchor}$, $x^l_{L2} = x^{2,l}_{L2} - (x^{2,raw}_{anchor} - \Delta x^{CRA}_{anchor}) + x^l_{anchor}$, $x^r_{L2} = x^{2,r}_{L2} - (x^{2,raw}_{anchor} - \Delta x^{CRA}_{anchor}) + x^l_{anchor}$.

Here, $\Delta x^{CRA}_{anchor}$ denotes the calibration of the anchor positions in relation to the chief-ray-angle-dependence (CRA-dependence). The following applies: $\Delta x^{CRA}_{anchor} = x^{CRA}_{anchor} - x^{CRA=0}_{anchor}$, where $x^{CRA=0}_{anchor}$ denotes the position of the anchoring element at the chief ray angle corresponding to the chief ray in the centre of the scanner field or in the centre of the mask 1.

From this, the edge placement error (EPE) is determined as follows:

$EPE(x)^{raw}_{L1,l} = x^l_{L1} - x^{l,setpoint}_{L1}$, where $x^{l,setpoint}_{L1}$ denotes the predetermined setpoint position of the left edge of the stripe L1. The edge placement errors of the remaining edges emerge correspondingly.

By subtracting the correctables determined from the data established in the first measuring step 2, it is still possible to determine a corrected EPE from the $EPE^{raw}$.

What is claimed is:

1. A set, comprising:
a plurality of different microlithographic masks, each microlithographic mask comprising:
a metrology marker, comprising:
an anchoring element configured so that its global position data on the microlithographic mask are establishable via an optical method using a measurement wavelength; and
a test structure comprising structure elements imageable on a wafer with radiation at an imaging wavelength when the microlithographic mask is used,
wherein for each microlithographic mask:
a maximum distance of the structure elements of the test structure from the anchoring element is no more than one tenth of a side length of the microlithographic mask;
the structure elements of the test structure are different from the structure elements of the test structure of all the other microlithographic masks; and
the anchoring element is identical to the anchoring element of all the other microlithographic masks.

2. The set of claim 1, wherein, for each microlithographic mask, the maximum distance of the structure elements of the test structure from the anchoring element is no more than one hundredth of the side length of the microlithographic mask.

3. The set of claim 1, wherein, for each microlithographic mask, the maximum distance of the structure elements of the test structure from the anchoring element is no more than one millimeter.

4. The set of claim 1, wherein, for each microlithographic mask, the maximum distance of the structure elements of the test structure from the anchoring element is no more than 100 μm.

5. The set of claim 1, wherein, for each microlithographic mask, the metrology marker comprises a plurality of anchoring elements.

6. The set of claim 5, wherein, for each anchoring element, its global position data on its corresponding microlithographic mask are establishable via an optical method using the measurement wavelength.

7. The set of claim 6, wherein, for each microlithographic mask:
the metrology marker comprises a plurality of test structures; and
each test structure is imageable on a wafer with radiation at the imaging wavelength when the microlithographic mask is used.

8. The set of claim 5, wherein, for each microlithographic mask:
the metrology marker comprises a plurality of test structures; and
each test structure is imageable on a wafer with radiation at the imaging wavelength when the microlithographic mask is used.

9. The set of claim 8, wherein, for each microlithographic mask, the maximum distance of the structure elements of the test structure from the anchoring element is no more than one hundredth of the side length of the microlithographic mask.

10. The set of claim 8, wherein, for each microlithographic mask, the maximum distance of the structure elements of the test structure from the anchoring element is no more than one millimeter.

11. The set of claim 8, wherein, for each microlithographic mask, the maximum distance of the structure elements of the test structure from the anchoring element is no more than 100 μm.

12. The set claim 7, wherein, for each microlithographic mask, the maximum distance of the structure elements of the test structure from the anchoring element is no more than one hundredth of the side length of the microlithographic mask.

13. The set of claim 7, wherein, for each microlithographic mask, the maximum distance of the structure elements of the test structure from the anchoring element is no more than one millimeter.

14. The set of claim 7, wherein, for each microlithographic mask, the maximum distance of the structure elements of the test structure from the anchoring element is no more than 100 μm.

15. The set of claim 6, wherein, for each microlithographic mask, the maximum distance of the structure elements of the test structure from the anchoring element is no more than one hundredth of the side length of the microlithographic mask.

16. The set of claim 6, wherein, for each microlithographic mask, the maximum distance of the structure elements of the test structure from the anchoring element is no more than one millimeter.

17. The set of claim 6, wherein, for each microlithographic mask, the maximum distance of the structure elements of the test structure from the anchoring element is no more than 100 μm.

18. The set of claim 1, wherein the imaging wavelength is in the EUV range.

19. The mask of claim 18, wherein, for each microlithographic mask, the microlithographic mask is reflective at the imaging wavelength.

20. A set of claim 1, wherein, for each microlithographic mask, the anchoring element is arranged at an identical position on the microlithographic mask.

* * * * *

UNITED STATES PATENT AND TRADEMARK OFFICE
CERTIFICATE OF CORRECTION

PATENT NO. : 10,761,420 B2
APPLICATION NO. : 16/167064
DATED : September 1, 2020
INVENTOR(S) : Dirk Hellweg It is certified that error appears in the above-identified patent and that said Letters Patent is hereby corrected as shown below:

Column 8, Line 66, delete "1." and insert -- l. --;

Column 16, Line 28, Claim 12, after "set" insert -- of --;

Column 16, Line 33, Claim 13, after "set" insert -- of --;

Column 16, Line 56, Claim 19, delete "mask" and insert -- set --.

Signed and Sealed this
Twentieth Day of October, 2020

Andrei Iancu
*Director of the United States Patent and Trademark Office*